United States Patent
Nagatomo

(10) Patent No.: US 8,249,126 B2
(45) Date of Patent: Aug. 21, 2012

(54) PHOTONIC CRYSTAL AND SURFACE EMITTING LASER USING SUCH PHOTONIC CRYSTAL

(75) Inventor: Yasuhiro Nagatomo, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 3 days.

(21) Appl. No.: 12/389,491

(22) Filed: Feb. 20, 2009

(65) Prior Publication Data

US 2009/0225805 A1 Sep. 10, 2009

(30) Foreign Application Priority Data

Mar. 6, 2008 (JP) ................................. 2008-056080

(51) Int. Cl.
*H01S 3/08* (2006.01)

(52) U.S. Cl. ........................ 372/99; 372/50.124; 372/92

(58) Field of Classification Search ............. 372/50.124, 372/92, 99
See application file for complete search history.

(56) References Cited

U.S. PATENT DOCUMENTS

| | | | |
|---|---|---|---|
| 6,055,262 A | 4/2000 | Cox et al. | 372/96 |
| 6,466,709 B1 * | 10/2002 | Scherer et al. | 385/15 |
| 7,483,466 B2 * | 1/2009 | Uchida et al. | 372/50.11 |
| 7,483,469 B2 * | 1/2009 | Mochizuki | 372/50.124 |
| 7,492,979 B2 * | 2/2009 | Wang et al. | 385/12 |
| 7,499,480 B2 | 3/2009 | Nagatomo | 372/50.124 |
| 7,535,946 B2 * | 5/2009 | Nagatomo et al. | 372/50.124 |
| 7,539,226 B2 * | 5/2009 | Uchida | 372/43.01 |
| 7,668,220 B2 * | 2/2010 | Lipson et al. | 372/50.124 |
| 7,679,098 B2 * | 3/2010 | Corzine | 257/99 |
| 2006/0245464 A1 * | 11/2006 | Hori et al. | 372/99 |
| 2007/0036189 A1 * | 2/2007 | Hori et al. | 372/50.11 |
| 2007/0121694 A1 * | 5/2007 | Okamoto | 372/50.124 |
| 2007/0201526 A1 * | 8/2007 | Hori | 372/50.124 |
| 2007/0201527 A1 * | 8/2007 | Hori et al. | 372/50.124 |
| 2008/0117942 A1 * | 5/2008 | Nagatomo et al. | 372/19 |
| 2008/0259984 A1 | 10/2008 | Nagatomo | 372/50.1 |
| 2009/0074026 A1 | 3/2009 | Nagatomo et al. | 372/50.124 |

FOREIGN PATENT DOCUMENTS

| | | |
|---|---|---|
| JP | 2000-332351 A | 11/2000 |
| WO | WO 02/073753 A2 | 9/2002 |
| WO | WO 2004/105094 A2 | 12/2004 |
| WO | WO 2007119761 A2 * | 10/2007 |

OTHER PUBLICATIONS

RefractiveIndex.INFO, http://refractiveindex.info/?group=CRYSTALS&material=AlGaAs.*
V. Lousse et al., "Angular and polarization properties of a photonic crystal slab mirror," Optics Express, vol. 12, No. 8, Apr. 19, 2004, pp. 1575-1583.

* cited by examiner

*Primary Examiner* — Yuanda Zhang
(74) *Attorney, Agent, or Firm* — Fitzpatrick, Cella, Harper & Scinto

(57) ABSTRACT

A photonic crystal that can spatially control the resonance efficiency and reduce the leakage of light in transversal directions and a surface emitting laser that can be formed by using such a photonic crystal are provided. The photonic crystal has a first region and a second region having a same periodic structure as fundamental structures thereof and defects are introduced into the periodic structure of the first region, which is arranged around the second region.

11 Claims, 8 Drawing Sheets

PHOTONIC CRYSTAL AND SURFACE EMITTING LASER USING SUCH PHOTONIC CRYSTAL

BACKGROUND OF THE INVENTION

1. Field of the Invention

This invention relates to a photonic crystal and a surface emitting laser using such a photonic crystal.

2. Description of the Related Art

In recent years there have been a number of reports on applications of a photonic crystal to a semiconductor laser. Japanese Patent Application Laid-Open No. 2000-332351 describes a semiconductor light-emitting device (surface emitting laser) produced by arranging an active layer containing a light emitting material and forming a two-dimensional photonic crystal near the active layer. It is a type of distributed feedback (DFB) laser. Cylindrical holes are periodically arranged in the semiconductor layer of the two-dimensional photonic crystal and the refractive index distribution thereof illustrates a two-dimensional periodicity. Light generated in the active layer resonates to form a standing wave and give rise to a laser oscillation due to the periodicity. It operates as a surface emitting laser as light is taken out in the direction perpendicular to the surface by primary diffraction.

U.S. Pat. No. 6,055,262 discloses a photonic crystal surface emitting laser having a configuration different from the one described in the above Japanese Patent Application Laid-Open No. 2000-332351. It is a sort of vertical cavity surface emitting laser (VCSEL) in which at least one of the pair of mirrors forming the resonator is formed by a periodic structure (photonic crystal). Light having a specific wavelength gives rise to a phenomenon referred to as GR (guided resonance) out of light striking into the photonic crystal in the directions from out of the plane to the inside and is reflected at a high reflectance (see V Lousse et al.: Opt. Express, Vol. 12, No. 8, p. 1575 (2004)). In short, a photonic crystal operates as a mirror having a high reflectance in the photonic crystal surface emitting laser.

SUMMARY OF THE INVENTION

Both of the above-described known photonic crystal surface emitting lasers utilize the resonance phenomenon of photonic crystal and commonly have the following problem. Since a uniform photonic crystal is employed in both of the above-cited Japanese Patent Application Laid-Open No. 2000-332351 and U.S. Pat. No. 6,055,262, resonance takes place uniformly on the entire surface of the photonic crystal to make it difficult to spatially control the laser oscillation region. The resonance efficiency needs to be spatially controlled in order to spatially control the laser oscillation region. More specifically, the oscillation efficiency needs to be raised in a region where it is desired to give rise to a laser oscillation, whereas the oscillation efficiency needs to be lowered in a region where it is not desired to give rise to a laser oscillation.

Apart from the above-identified problem, there is a problem that resonating light leaks in transversal directions (in in-plane directions) when the size of the photonic crystal is limited. To reduce such leakage of light, it is desirable that a region surrounding the laser oscillation region provides a resonance effect at the wavelength same as the wavelength of the laser oscillation region. A structure that can spatially modulate the resonance efficiency without shifting the resonance wavelength of the photonic crystal has been wanted to solve the above-identified two problems at the same time.

In view of the above-identified problems, it is the object of the present invention to provide a photonic crystal that can spatially control the resonance efficiency and reduce the leakage of light in transversal directions and a surface emitting laser using such a photonic crystal.

According to the present invention, it is now possible to realize a photonic crystal that can spatially control the resonance efficiency and reduce the leakage of light in transversal directions and a surface emitting laser using such a photonic crystal.

Further features of the present invention will become apparent from the following description of exemplary embodiments given below with reference to the attached drawings.

DESCRIPTION OF THE EMBODIMENTS

Now, the present invention will be described in greater detail by referring to the accompanying drawings that illustrate embodiments of the present invention.

First Embodiment

The first embodiment of the present invention, which is a photonic crystal according to the present invention, will be described below.

Figure 1:
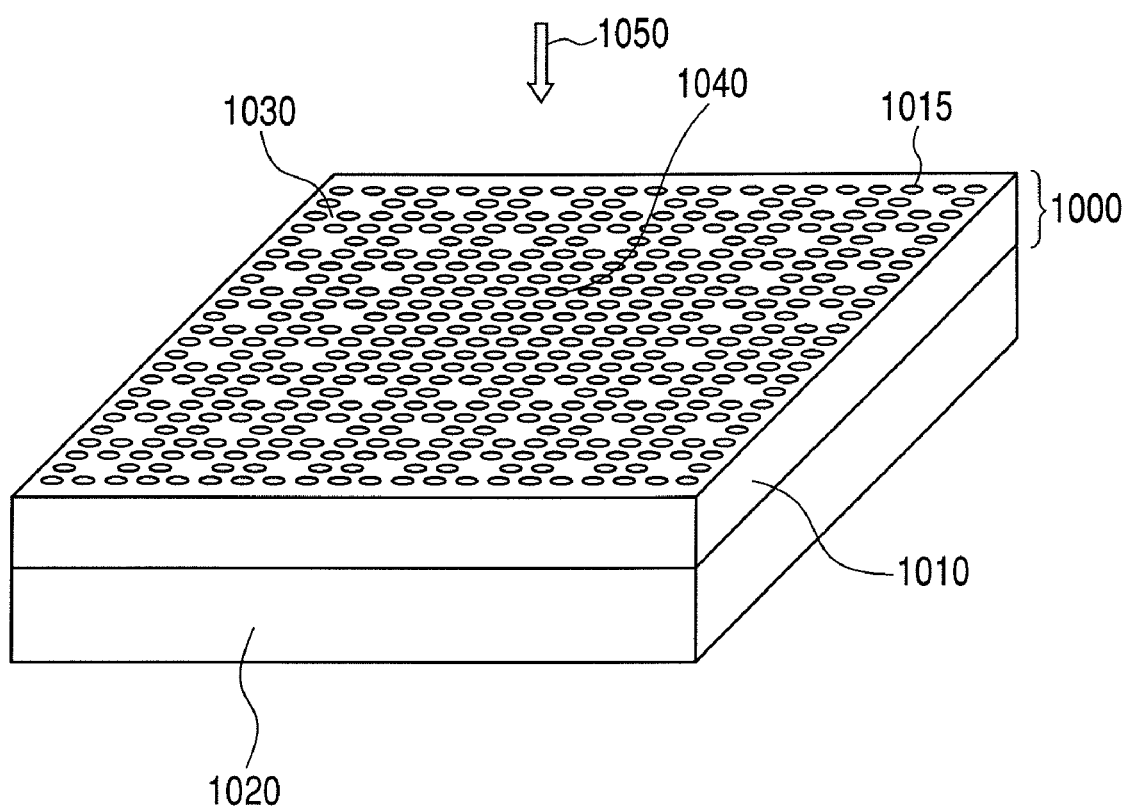
FIG. 1 is a schematic illustration of the photonic crystal according to a first embodiment of the present invention.

FIG. 1 is a schematic illustration of the photonic crystal according to a first embodiment of the present invention. In FIG. 1, 1000 denotes a photonic crystal layer formed by arranging a plurality of holes 1015 in a first member 1010 and 1020 denotes a substrate The photonic crystal layer 1000 has a uniform photonic crystal region (a second region 1040) at and near its center and a region (a first region 1030) including parts where the periodicity is disturbed by filling holes. A part where the basic periodic structure is disturbed is generally referred to as a defect and a region where a plurality of defects is arranged is referred to as a defect region. The photonic crystal of this embodiment is designed to reflect light 1050 striking into the photonic crystal layer 1000 illustrated in FIG. 1 in the directions from out of the plane to the inside. In other words, it is designed to give rise to a GR (guided resonance) relative to incident light having a wavelength of λ. Then, light 1050 striking into the photonic crystal 1000 in the directions from out of the plane to the inside is coupled to a waveguide mode for guiding light in the photonic crystal and subsequently the light 1050 is coupled to a radiation mode and radiated to the outside. It shows a reflectance substantially equal to 100% at a specific wavelength and hence operates as a mirror.

Figure 3A:
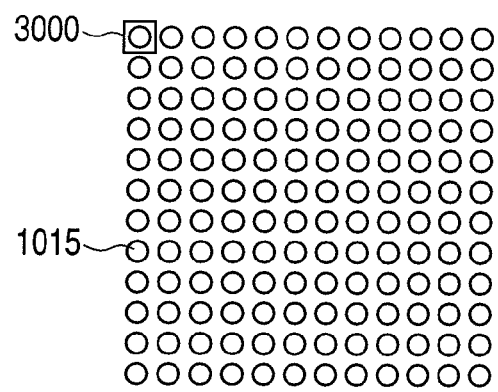
FIGS. 3A, 3B, 3C and 3D are schematic illustrations of possible arrangements of defects of the photonic crystal according to the first embodiment of the present invention that are contained in the periodic hole arrangement.
Figure 3B:
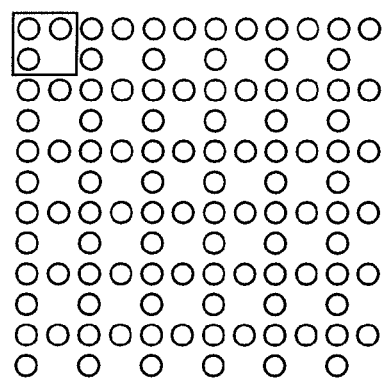
Figure 3C:
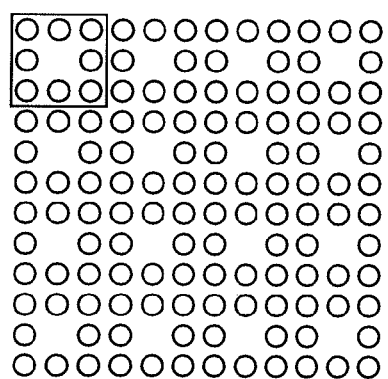
Figure 3D:
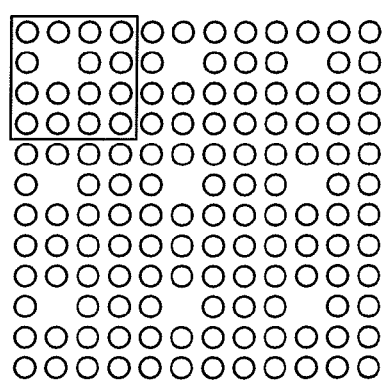

The resonance efficiency (reflectance) of the photonic crystal can be modulated by introducing defects into the photonic crystal. FIGS. 3A through 3D are schematic illustrations of possible arrangements of defects of the photonic crystal according to the first embodiment of the present invention that are contained in the periodic hole arrangement. FIG. 3A illustrates a no defect arrangement and FIG. 3B illustrates a defect arrangement where a defect is introduced in every other periods, whereas FIG. 3C illustrates a defect arrangement where a defect is introduced in every three periods and FIG. 3D illustrates a defect arrangement where a defect is introduced in every four periods. Note that defects are periodically arranged in the periodic structure of the photonic crystal. A unit cell 3000 of each of the structures is indicated by a square drawn by solid lines. A unit cell refers to a minimal unit for forming a periodic structure. Thus, a periodic structure is formed repetitively arranging such units. A unit cell includes one or more than one holes and may or may not include a defect. The size of a unit cell is large when the density of defects of the photonic crystal is low. When defects are arranged periodically, the area of a unit cell (the first unit cell) of a structure (any of FIGS. 3B through 3D) where defects are introduced is integer times of the area of a unit cell (the second unit cell) of a structure (FIG. 3A) where no defect is introduced.

Figure 2A:
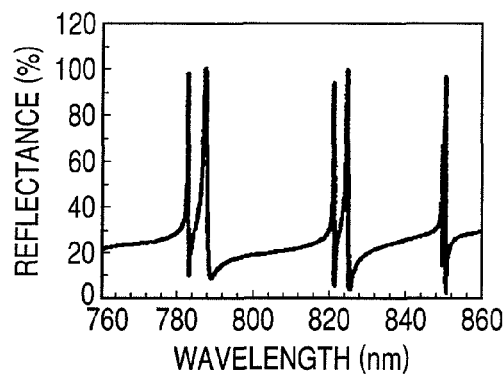
FIGS. 2A, 2B, 2C and 2D are graphs illustrating the reflection spectrums of the photonic crystal according to the first embodiment of the present invention.
Figure 2B:
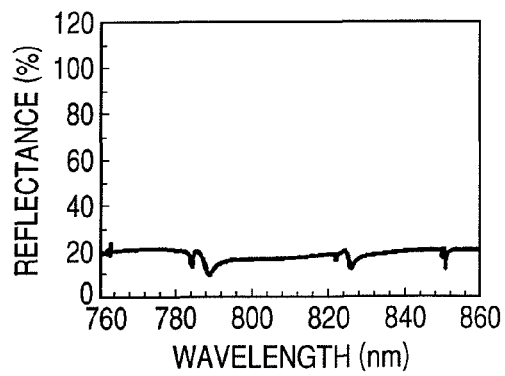
Figure 2C:
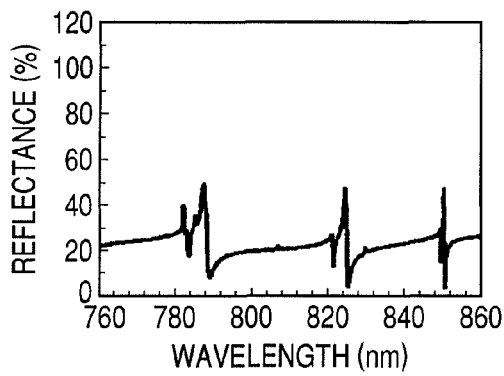
Figure 2D:
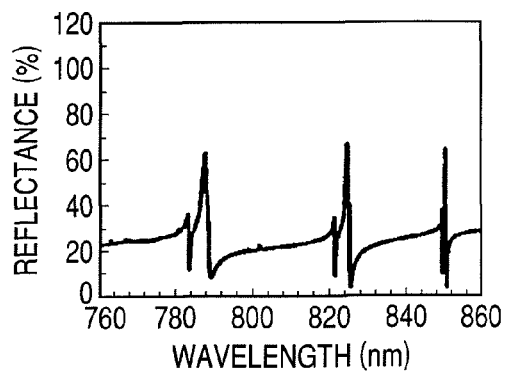

FIGS. 2A through 2D are graphs illustrating the reflection spectrums of the photonic crystal according to the first embodiment of the present invention. FIGS. 2A through 2D illustrate how the reflection spectrum changes when the density of introduced defects is changed. FIG. 2A is the reflection spectrum for a structure having no defect and FIG. 2B is the reflection spectrum of a structure where a defect is introduced in every other periods, whereas FIG. 2C is the reflection spectrum of a structure where a defect is introduced in every three periods and FIG. 2D is the reflection spectrum of a structure where a defect is introduced in every four periods. Each of FIGS. 2A through 2D corresponds to FIGS. 3A through 3D, respectively. When no defect is introduced (FIG. 2A), the peak reflectance at the resonance wavelength substantially gets to 100%. On the other hand, the peak reflectance falls from the density condition of FIG. 2D where the density of introduced defects is lowest to the density condition of FIG. 2B where the density of introduced defects is highest. Thus, a desired reflectance can be realized by controlling the density of defects and the resonance efficiency (reflectance) can be spatially modulated by spatially modulating the defect density.

The basic structure (the shape and the size of the elements other than the defects) is same for the structures of FIGS. 3A through 3D. The expression that the basic structure is same is applicable not only to situations where the elements are same in terms of shape and size but also to situations where they are not same due to preparation errors. In other words, they may not be same provided that the effect of this embodiment is ensured. It will be seen from FIGS. 2A through 2D that the wavelength at which GR (guided resonance) takes place is substantially held constant regardless of the density of defects when the basic structure is same. Thus, it is possible to realize a structure that can spatially modulate the resonance efficiency without shifting the resonance wavelength of photonic crystal. For example, it is possible to realize a structure that can spatially modulate the resonance efficiency without shifting the resonance wavelength of photonic crystal by forming a photonic crystal having a central region (light emitting region) and a region that is arranged around the central region and into which defects are introduced provided that it has a basic structure that is substantially same and is a periodic structure. More specifically, when a defect-free region (a second region 1040) is arranged at and near the center and a defect region (a first region 1030) is arranged around the defect-free region as illustrated in FIG. 1, the resonance efficiency (reflectance) can be spatially controlled without shifting the resonance wavelength of the central second region from that of the surrounding first region or vice versa. The reflectance is high at the second region 1040 and low at the first region 1030.

Because resonance takes place with a same wavelength in both the first region and the second region, there is provided an effect that light that leaks in transversal directions from the second region is reduced. Such an effect cannot be obtained when no photonic crystal is arranged around the second region, when the lattice shape and the lattice constant are varied or when the shape and the size of holes are varied, because no resonance takes place. Some of the results obtained when defects are arranged periodically in a periodic structure of photonic crystal are illustrated above and a similar effect can be expected when defects are arranged non-periodically. Such an instance can be provided when a third region into which defects are introduced non-periodically is arranged around a fourth region having a periodic structure that does not include any defect. Specific examples of non-periodic arrangements include instances where defects are arranged randomly and those where defects are arranged concentrically.

In terms of shape, a defect structure may be produced by partly filling a hole with resin or by modulating the shape and the size of an element that is employed to form a periodic structure (which is a hole in the case of FIG. 1). The size of the element may be equal to nil (in other words, a part that does not have any hole may be made to become a defect). It should be emphatically noted here that the present invention does not resort to utilization of a defect mode. Instances of introducing defects into a photonic crystal and utilizing it as resonator are known. Such instances utilize a mode that is newly produced by the defects, or a so-called defect mode (something like an impurity state). The present invention differs from those known instances because the present invention utilizes a mode that already exists without introducing defects.

Figure 11:
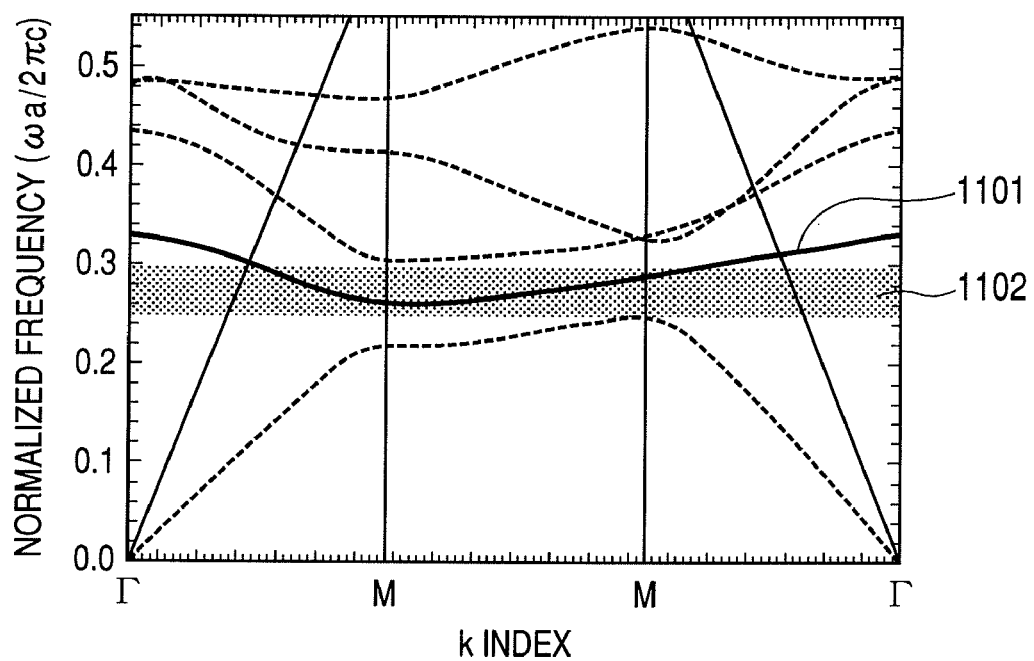
FIG. 11 is a schematic illustration of an exemplar defect mode in the photonic band according to the first embodiment of the present invention.

FIG. 11 is a schematic illustration of an exemplar defect mode in the photonic band of the first embodiment of the present invention.

In FIG. 11, the band indicated by solid line 1101 illustrates a defect mode. This mode appears when periodic disturbances (defects) are introduced into a photonic crystal. The bands indicated by dotted lines in FIG. 11 illustrate a mode that exists without introducing defects (to be referred to as "principal mode" hereinafter) The frequency band indicated by 1102 is referred to as photonic band gap where no principal mode exists (and hence no light can exist there unless defects are introduced) When a defect mode is used, the resonance frequency varies to a large extent according to the density of defects. As a result of the study made by the inventors of the present invention, it was found that the wavelength of GR (guided resonance) in a defect mode shifts toward the long wavelength side as the density of defects becomes low. To make the wavelength agree with the originally intended wavelength, the lattice constant and the hole diameter of the photonic crystal need to be reduced. It is difficult to prepare such a photonic crystal. Because this embodiment utilizes the principal mode, the resonance wavelength is substantially held to a constant level regardless of the density of defects as pointed out above. Thus, this embodiment is not entailed by the disadvantage of utilizing a defect mode for the preparation of photonic crystal.

The range of refractive index of the first member is between 1.2 and 4.0. Specific examples of materials having a refractive index found within the above range include Si, $SiO_2$, SiN, GaAs, $Al_xGa_{1-x}As$, AlAs, GaN, $Al_xGa_{1-x}N$, AlN and InP. The cross section of the holes formed in the photonic crystal layer may be circular, triangular, square or the like. In terms of shape, the lattice may be square or triangular. The thickness of the first member is determined by taking the waveguide mode of light, the conditions of preparing the first member and other factors into consideration, for example, the thickness thereof may typically be within a range between 10 nm and 10 μm.

Second Embodiment

Figure 4:
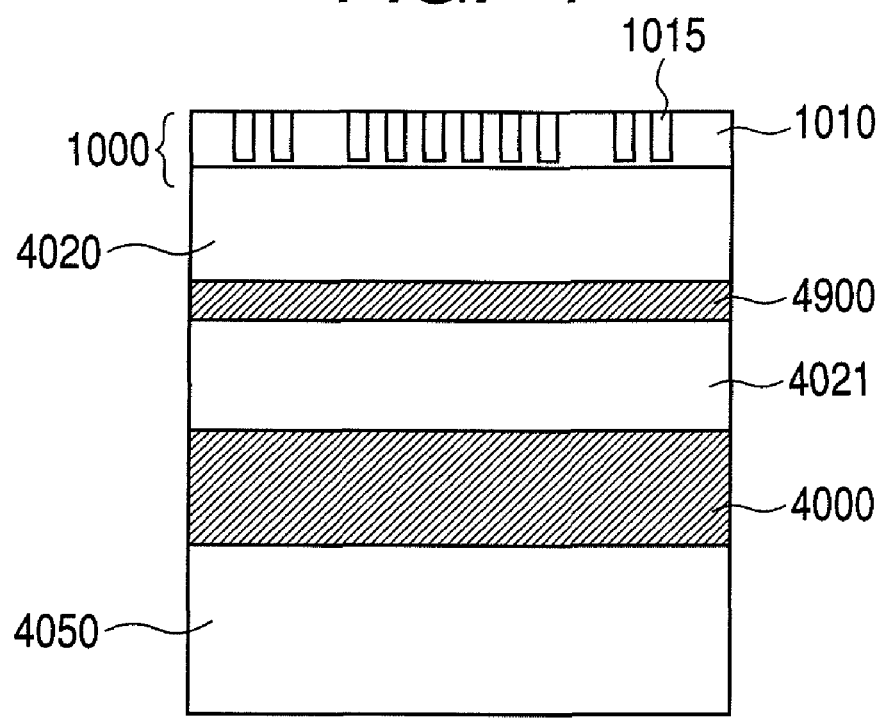
FIG. 4 is a schematic illustration of the surface emitting laser according to a second embodiment of the present invention.

Now, a second embodiment of the present invention that is a vertical cavity surface emitting laser (VCSEL) formed by using a photonic crystal according to the present invention will be described below. FIG. 4 is a schematic cross-sectional view of the VCSEL, illustrating the configuration thereof. Referring to FIG. 4, 4050 denotes a substrate and 4000 denotes a lower reflector mirror (e.g., a multilayer film mirror), while 4021 denotes a lower cladding layer and 4900 and 4020 respectively denote an active layer and an upper cladding layer. In FIG. 4, 1010 denotes a first member forming a photonic crystal layer 1000 and 1015 denotes one of the holes arranged periodically in the first member 1010. The technical description given hereinafter in Example 1 is applicable to the photonic crystal 1000.

A laser oscillation is realized in a VCSEL type surface emitting laser by reflecting light generated from the active layer 4900 by means of upper and lower mirrors and amplifying the light by means of the active layer. The wavelength of light emitted from the active layer 4900 is determined by the material of the active layer and the layer arrangement. The photonic crystal operates as upper reflector mirror when the resonance wavelength of the photonic crystal is designed so as to correspond to the wavelength of emitted light. A VCSEL type surface emitting laser can be realized by using the photonic crystal 1000 arranged opposite to the lower reflector mirror 4000 as upper reflector mirror as illustrated in FIG. 4.

The reflectance relative to the resonance wavelength λ can be spatially modulated and the mode of laser oscillation can be controlled by controlling the density of the defects that are introduced into the photonic crystal. More specifically, for example, the reflectance at and near the center of the photonic crystal can be raised relative to the surrounding region by introducing defects into the surrounding region without introducing defects into a region at and near the center of the photonic crystal to make the laser easily oscillate only in a fundamental transverse mode, suppressing oscillations in higher order transverse modes. The size of the region where no defects are introduced is determined by taking the spot size of the fundamental transverse mode and higher order transverse modes into consideration. The diameter of the region is typically within a range between 1 μm and 100 μm. The size of the region where defects are introduced is determined by the spot size and the size of the entire device. The diameter of the region is typically within a range between 2 μm and 200 μm. A multilayer film mirror made of a material selected from those listed below is employed for the lower reflector mirror: $Al_xGa_{1-x}As/Al_xGa_{1-x}As$, $GaN/Al_xGa_{1-x}N$, $In_xGa_{1-x}As_yP_{1-y}/In_xGa_{1-x}As_yP_{1-y}$. A photonic crystal described above for the first embodiment may also be applicable.

Now, the active layer, the cladding layer, the substrate and so on of the vertical cavity surface emitting laser of this embodiment will be described below. The active layer 4900 is a multi-quantum well structure formed by using a material typically selected from GaAs/AlGaAs, GaInP/AlGaInP and GaN/InGaN. The cladding layer 4021 is made of a material typically selected from AlGaAS, AlGaInP and AlGaN. The substrate 4050 is made of a material typically selected from GaAs and GaN. The surface emitting laser of this embodiment can be driven typically by a photo-excitation system or a current injection system. The electrodes are omitted in FIG. 4. The mirror formed so as to include the photonic crystal layer may also be referred to as the first reflector mirror, whereas the mirror arranged opposite to the first reflector mirror may also be referred to as the second reflector mirror. The first reflector mirror may be made to operate as the upper reflector mirror as described above or alternatively as the lower reflector mirror.

Third Embodiment

Figure 5:
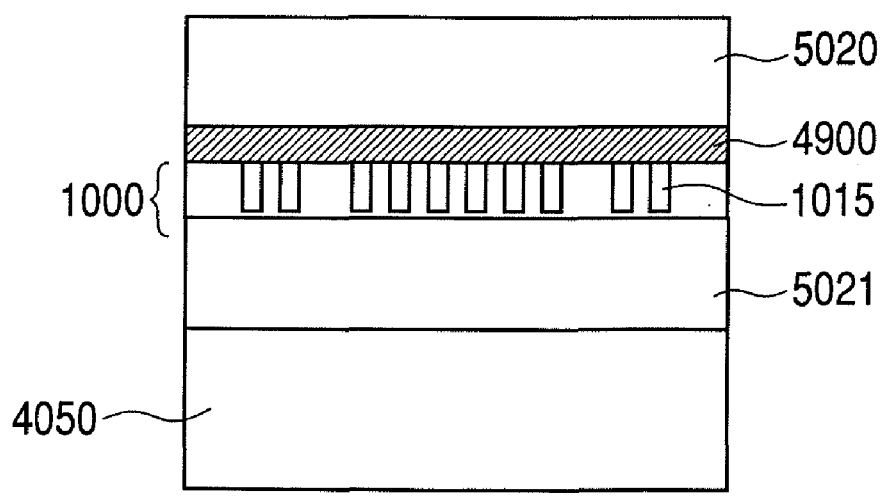
FIG. 5 is a schematic illustration of the surface emitting laser according to a third embodiment of the present invention.

A distributed feedback (DFB) surface emitting laser formed by using a photonic crystal according to the present invention will be described as the third embodiment of the invention. FIG. 5 is a schematic cross-sectional view of the surface emitting laser of the third embodiment which is a DFB laser. Referring to FIG. 5, 4050 denotes a substrate and 5021 denotes a lower cladding layer, whereas 1000 denotes a photonic crystal layer (to be also referred to as optical resonance layer hereinafter) and 4900 and 5020 respectively denote an active layer and an upper cladding layer.

In a DFB type surface emitting laser, light generated from the active layer 4900 strikes the photonic crystal layer 1000. Incident light becomes light in a waveguide mode and resonates in in-plane directions of the photonic crystal layer 1000 and amplified. Subsequently, it is coupled to a radiation mode and radiated to the outside of the photonic crystal layer. As a result, coherent light is emitted through the upper cladding layer 5020 by surface emission.

The resonance efficiency of the photonic crystal layer influences the threshold value of laser oscillation. More specifically, the laser oscillates at a low excitation intensity when the resonance efficiency is high, whereas a high excitation intensity is required when the resonance efficiency is low. Since the resonance efficiency can be spatially modulated by spatially modulating the density of introduced defects as pointed out above, it is possible to produce a region that does not oscillate and a region that oscillates when the entire photonic crystal is excited at a constant excitation intensity. This embodiment is so designed that the reflectance is higher at and near the center of the photonic crystal than in the surrounding region for wavelength λ by not arranging any defect at and near the center of the photonic crystal but introducing defects in the surrounding region. Thus, a structure that operates for laser oscillation at and near the center of the photonic crystal but does not operates for laser oscillation in the surrounding region is realized. Note that the photonic crystal operates not as a mirror but as a resonator in this embodiment. The lower reflector mirror 4000 described above for the second embodiment is not indispensably necessary in this embodiment because this embodiment is not designed to form a vertical resonator unlike the second embodiment.

A member as described above for the first embodiment can be employed for the cladding layer. The materials described above for the first embodiment can be used for the substrate 4050 and the active layer 4900. While the active layer 4900 may be arranged at any position where the photonic crystal layer 1000 that operates as optical resonance layer can be optically coupled to the active layer 4900 in this embodiment, it is preferably arranged at a position located close to the photonic crystal layer for the purpose of obtaining a large gain. For example, the active layer 4900 may be arranged on the photonic crystal layer 1000. Alternatively, the active layer 4900 may be arranged in the inside of the photonic crystal layer 1000. While the cladding layer is a low refractive index layer in the above description, the substrate 4050 may alternatively be made to be a low refractive index layer In other words, the present invention includes a laser where a photonic crystal layer 1000 is formed on a substrate 4050.

Thus, a structure that can arbitrarily modulate the resonance efficiency by shifting the resonance wavelength of a photonic crystal can be provided by any of the above-described embodiments. Therefore, it is possible to realize a photonic crystal that can spatially control the resonance efficiency and has an effect of reducing the leakage of light in transversal directions and a surface emitting laser formed by using such a photonic crystal.

EXAMPLES

Now, the present invention will be described further by way of examples.

Example 1

Figure 6:
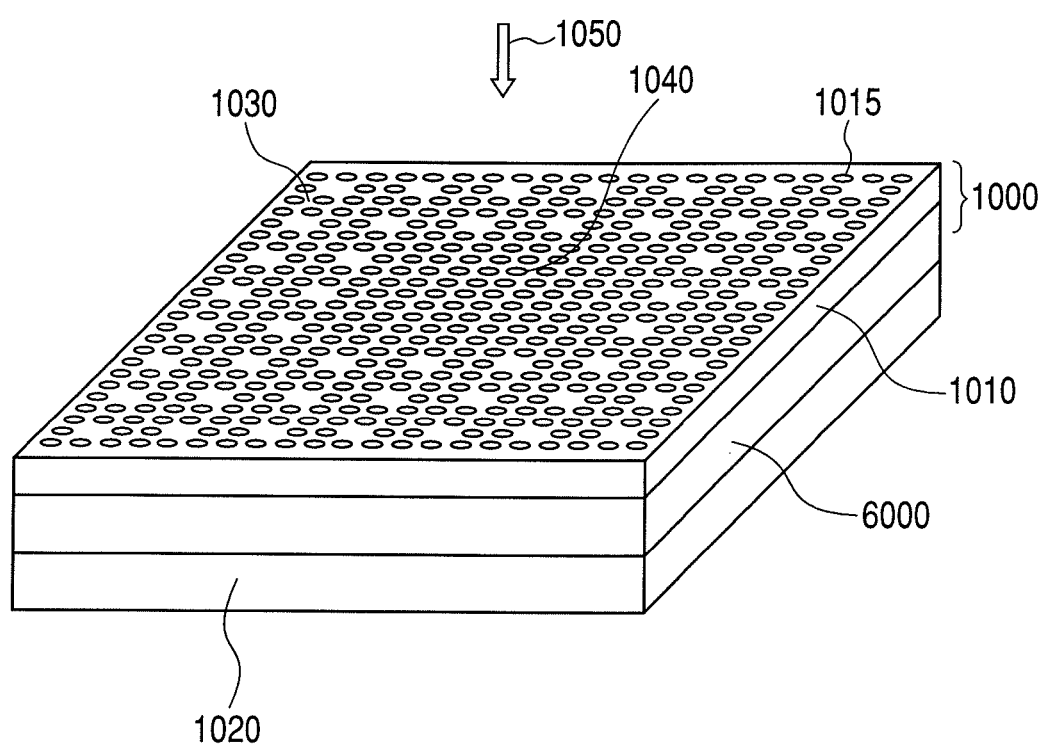
FIG. 6 is a schematic illustration of the photonic crystal according to Example 1 of the present invention.

A two-dimensional photonic crystal mirror formed by applying the present invention will be described in Example 1. FIG. 6 is a schematic illustration of the photonic crystal of this example. In FIG. 6, 1000 denotes a photonic crystal layer having cylindrical holes 1015 arranged in the form of a square lattice in an $Al_{0.4}Ga_{0.6}N$ layer 1010. The layer has a thickness of 200 nm and the holes are arranged at regular intervals of 180 nm and have a diameter of 160 nm and a depth of 200 nm. A region 1040 that is free from defects is arranged at and near the center of the photonic crystal with a diameter of 20 µm while a region 1030 that includes defects is arranged around the former region. In FIG. 6, 6000 denotes a waveguide layer made of GaN and having a thickness of 200 nm and 1020 denotes an $Al_{0.4}Ga_{0.6}N$ substrate.

Figure 7A:
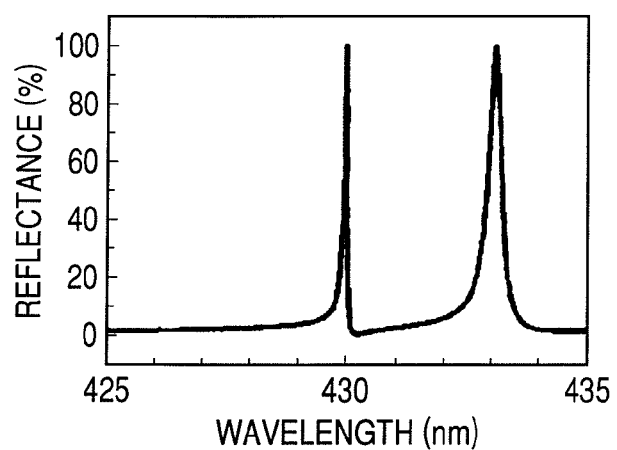
FIGS. 7A and 7B are graphs illustrating the reflection spectrums of the photonic crystal according to Example 1 of the present invention.
Figure 7B:
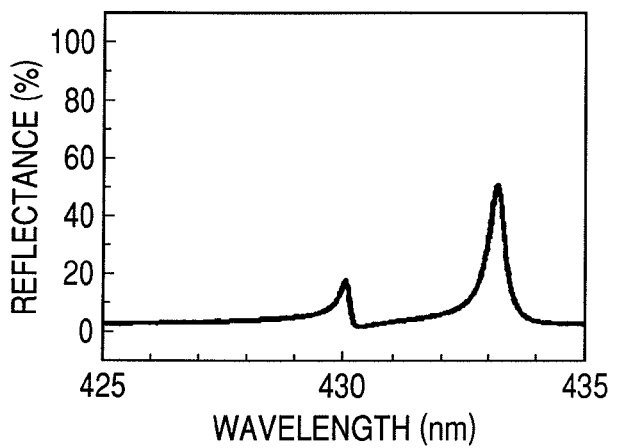

FIGS. 7A and 7B are graphs illustrating the reflection spectrums of the arrangement of FIG. 6 obtained by computations. The spectrums are obtained on the basis that the refractive index of GaN is 2.54 and that of $Al_{0.4}Ga_{0.6}N$ is 2.32. For the convenience of computations, the thickness of the substrate 1020 is assumed to be infinite. FIG. 7A illustrates the reflection spectrum of the region 1040 that is free from defects. There exist wavelength zones at or near the wavelength 430 nm and wavelength 433 nm where the reflectance abruptly rises. Therefore, such an arrangement can be operated as a high reflectance mirror FIG. 7B illustrates the reflection spectrum of the region 1030 into which defects are introduced. Defects are introduced at a rate of one in every four periods. In other words, a hole in every sixteen holes is buried. If compared with FIG. 7A, it will be seen that the maximum reflectance values are smaller although the wavelengths of reflection peaks remain same. With the arrangement of this example, it is possible to realize a mirror in which the resonance wavelength is same over the entire surface of the photonic crystal but the reflectance is high at or near the center of the photonic crystal and low in the surrounding area.

Example 2

Figure 8:
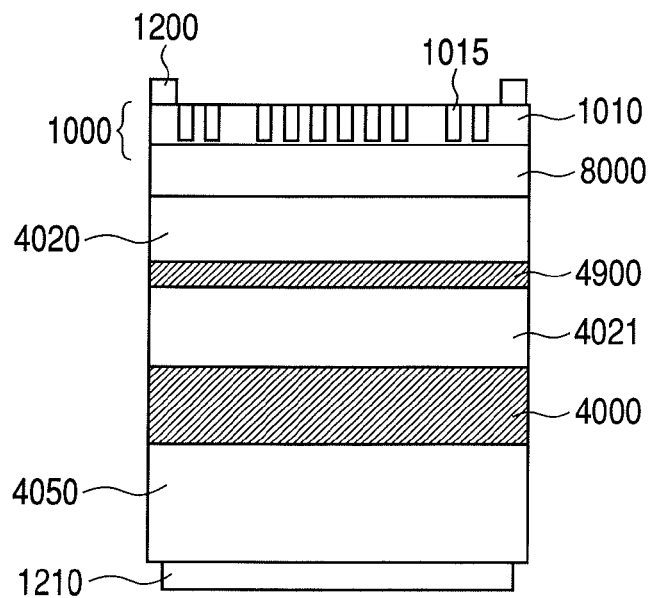
FIG. 8 is a schematic illustration of the surface emitting laser according to Example 2 of the present invention.

A vertical cavity surface emitting laser (VCSEL) formed by applying the present invention will be described in Example 2. FIG. 8 is a schematic illustration of the surface emitting laser of this example. In FIG. 8, 1000 denotes a photonic crystal layer formed by arranging holes 1015 in the form of a square lattice in an $Al_{0.85}Ga_{0.15}As$ layer 1010. The layer has a thickness of 200 nm and the holes are arranged at intervals of 250 nm and have a diameter of 200 nm and a depth of 200 nm. In FIG. 8, 8000 denotes an $Al_{0.3}Ga_{0.7}As$ layer and 4020 denotes a p-type $Al_{0.85}Ga_{0.15}As$ cladding layer, whereas 4900 denotes a $GaAs/Al_{0.3}Ga_{0.7}As$ multi quantum well active layer. 4021 denotes an n-type $Al_{0.85}Ga_{0.15}As$ cladding layer and 4000 denotes a lower mirror layer of n-type DBR, whereas 4050 denotes a GaAs substrate and 1200 and 1210 respectively denote a ring type upper electrode and a lower electrode.

Figure 9A:
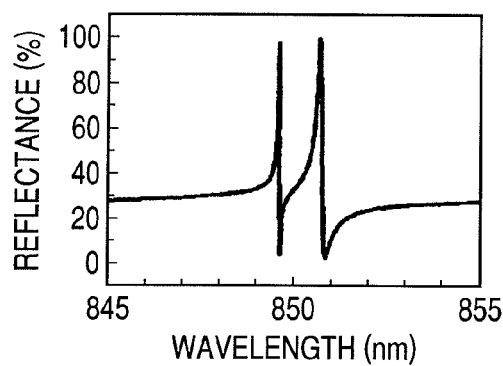
FIGS. 9A, 9B, 9C and 9D are graphs illustrating the reflection spectrums of the photonic crystal mirror of the surface emitting laser according to Example 2 of the present invention.
Figure 9B:
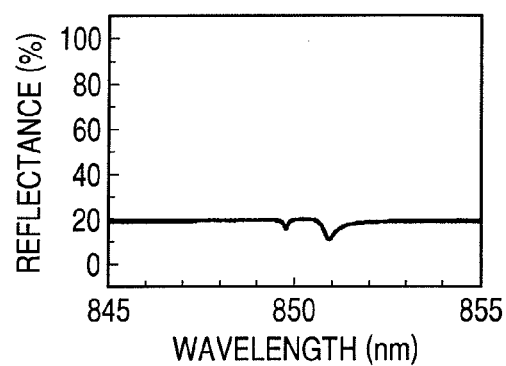
Figure 9C:
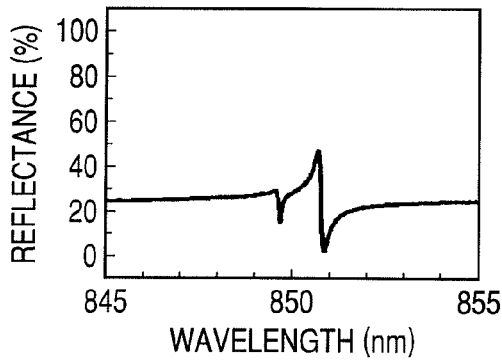
Figure 9D:
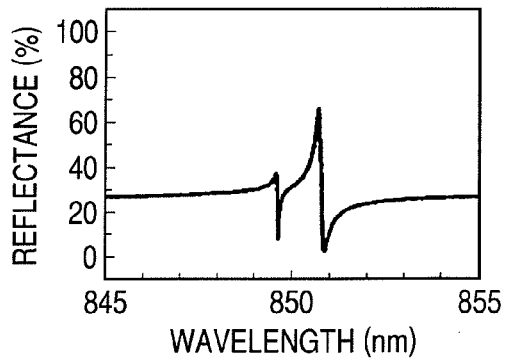

FIGS. 9A through 9D are graphs illustrating the reflection spectrums of a photonic crystal as illustrated in FIG. 8 that are obtained by computations. FIG. 9A illustrates the reflection spectrum of a structure that is free from defects. FIG. 9B illustrates the reflection spectrum of a structure into which defects are introduced at a rate of one in every two periods and FIG. 9C illustrates the reflection spectrum of a structure into which defects are introduced at a rate of one in every three periods, whereas FIG. 9D illustrates the reflection spectrum of a structure into which defects are introduced at a rate of one in every four periods. It is assumed here that defects are introduced periodically into the photonic crystal. From FIG. 9A, it will be seen that a photonic crystal into which no defects are introduced operates as a mirror illustrating a high reflectance at and near the wavelength 849.5 nm and wavelength 851 nm. From FIGS. 9B through 9D, it will also be seen that the peak reflectance falls as the density of defects rises.

No defect is arranged in a region having a diameter of 5 µm and located at and near the center of the photonic crystal of this example. On the other hand, defects are introduced in the surrounding region at a rate of one in every four periods (one in every sixteen holes). With this arrangement, it is possible to realize a mirror having a reflectance of about 100% at and near the center thereof and a reflectance of about 50% in the surrounding region. Thus, it is possible to realize a laser that suppresses oscillations in higher order transverse modes and oscillates only in the fundamental transverse mode. The lower mirror layer 4000 is designed to illustrate a high reflectance at the wavelength same as the wavelength at which the photonic crystal layer illustrates a high reflectance. The resonator length that is determined by the gap between the photonic crystal layer 1000 and the lower mirror layer 4000 is designed such that the antinodes of the standing wave formed in the resonator overlap the active layer 4900 by applying a technique that is popularly employed for designing a surface emitting laser. With the above-described arrangement, it is possible to realize a laser oscillation by causing light generated from the active layer 4900 to resonate and become amplified by the upper and lower mirrors.

Example 3

Figure 10:
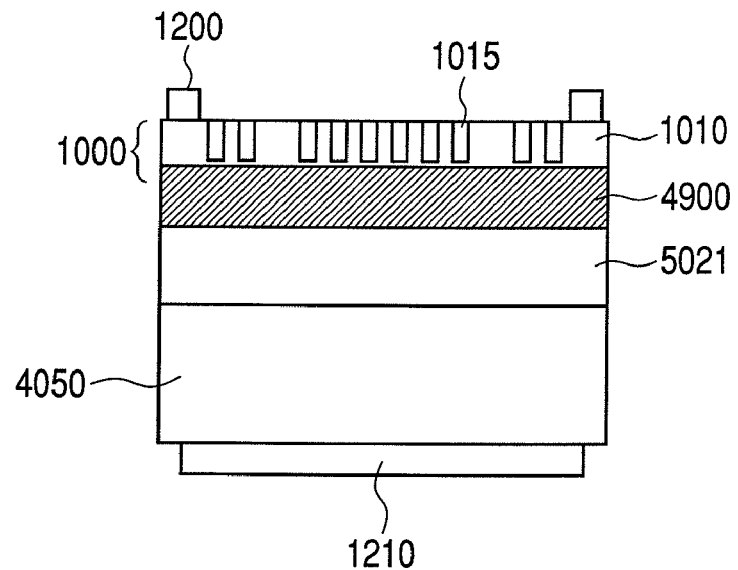
FIG. 10 is a schematic illustration of the surface emitting laser according to Example 3 of the present invention.

A distributed feedback (DFB) surface emitting laser formed by applying the present invention will be described in Example 3. FIG. 10 is a schematic illustration of the surface emitting laser of this example. Referring to FIG. 10, 4050 denotes a GaAs substrate and 5021 denotes an n-type $Al_{0.85}Ga_{0.15}As$ cladding layer, whereas 4900 denotes an active layer that includes a $GaAs/Al_{0.3}Ga_{0.7}As$ multi quantum well. In FIG. 10, 1000 denotes a photonic crystal layer formed by arranging holes 1015 in the form of a square lattice in a layer 1010 made of p-type $Al_{0.85}Ga_{0.15}As$ and 1200 and 1210 respectively denote a ring type upper electrode and a lower electrode.

No defect is arranged in a region having a diameter of 10 μm and located at and near the center of the photonic crystal of this example. On the other hand, defects are introduced in the surrounding region at a rate of one in every three periods (one in every nine holes) in a non-periodic manner. With the arrangement of this example, light generated from the active layer resonates at and near the wavelength 850 nm in the entire photonic crystal. However, as described above, the resonance efficiency falls and the laser oscillation threshold value rises in the region where defects are introduced so that a laser oscillation takes place only at and near the center of the photonic crystal. No laser oscillation takes place in the surrounding region because the excitation intensity does not get to the oscillation threshold value but resonance takes place at the wavelength same as the laser oscillation wavelength to provide an effect of reducing the leakage of light laser-oscillated at and near the center in transversal directions. With the above arrangement, it is possible to realize a surface emitting laser having a photonic crystal that provides an effect of spatially controlling the laser oscillation region and reducing the leakage of light in transversal directions.

While the present invention has been described with reflectance to exemplary embodiments, it is to be understood that the invention is not limited to the disclosed exemplary embodiments. The scope of the following claims is to be accorded the broadest interpretations so as to encompass all such modifications and equivalent structures and functions.

This application claims the benefit of Japanese Patent Application No. 2008-056080, filed Mar. 6, 2008, which is hereby incorporated by reflectance herein in its entirety.

What is claimed is:

1. A surface emitting laser that oscillates at a wavelength $\lambda$, comprising:
    a photonic crystal;
    a first reflector mirror formed to include said photonic crystal;
    a second reflector mirror arranged opposite to said first reflector mirror; and
    an active layer arranged between said first reflector mirror and said second reflector mirror,
    wherein said photonic crystal comprises:
        a first region having a fundamental periodic structure and provided with defects introduced into said fundamental periodic structure, and adapted to reflect light of the wavelength $\lambda$; and
        a second region having a fundamental periodic structure the same as that of said first region and adapted to reflect light of the wavelength $\lambda$, said second region having no defects introduced thereinto,
        wherein said first region has a lower reflectance with respect to light of the wavelength $\lambda$ than does said second region,
        wherein said second region is arranged at a center portion of said photonic crystal, and said first region is arranged in a surrounding region around said second region,
        wherein said photonic crystal is configured to have at least three refractive index periods in at least two directions in said second region, and
    wherein laser oscillation does not take place at said first region while laser oscillation takes place at said second region.

2. The surface emitting laser according to claim 1, wherein said defects are periodically arranged in said first region.

3. The surface emitting laser according to claim 2, wherein said fundamental periodic structure of said first region is formed by repetitively arranging a first unit cell, and said fundamental periodic structure of said second region is formed by repetitively arranging a second unit cell, and an area of said first unit cell is an integer times an area of said second unit cell.

4. The surface emitting laser according to claim 3, wherein holes constituting said first unit cell are different from said defects introduced into said first unit cell and have a same shape and size as holes constituting said second unit cell.

5. The surface emitting laser according to claim 1, wherein said defects are arranged in a non-periodic manner in said first region.

6. The surface emitting laser according to claim 1, wherein said defects are formed of holes filled with resin.

7. The surface emitting laser according to claim 1, wherein said defects are formed of holes having at least one of a modulated shape and a modulated size.

8. The surface emitting laser according to claim 1, wherein said second reflector mirror is formed to include a second photonic crystal the same as said photonic crystal included in said reflector mirror.

9. The surface emitting laser according to claim 1, wherein the diameter of said second region is not less than 1 μm.

10. The surface emitting laser according to claim 1, wherein said photonic crystal has only one second region and said second region is surrounded without intervening space by said first region.

11. A surface emitting laser that oscillates at a wavelength $\lambda$, comprising:
    a photonic crystal;
    an optical resonance layer formed to include said photonic crystal; and
    an active layer arranged at a position that allows said active layer to be optically coupled to said optical resonance layer,
    wherein said photonic crystal comprises:
        a first region having a fundamental periodic structure and provided with defects introduced into said fundamental periodic structure, and adapted to reflect light of the wavelength $\lambda$; and
        a second region having a fundamental periodic structure the same as that of said first region and adapted to reflect light of the wavelength $\lambda$, said second region having no defects introduced thereinto,
        wherein said first region has a lower reflectance with respect to light of the wavelength $\lambda$ than does said second region, wherein said second region is arranged at a center portion of said photonic crystal, and said first region is arranged in a surrounding region around said second region, wherein said photonic crystal is configured to have at least three refractive index periods in at least two directions in said second region, and wherein laser oscillation does not take place at said first region while laser oscillation takes place at said second region.

* * * * *